United States Patent
Liu et al.

(10) Patent No.: US 7,010,765 B2
(45) Date of Patent: Mar. 7, 2006

(54) METHOD FOR IDENTIFYING REMOVABLE INVERTERS IN AN IC DESIGN

(75) Inventors: I-Min Liu, Cupertino, CA (US); Wei-Lun Kao, Cupertino, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 369 days.

(21) Appl. No.: 10/435,345

(22) Filed: May 8, 2003

(65) Prior Publication Data

US 2004/0225979 A1    Nov. 11, 2004

(51) Int. Cl.
G06F 17/50   (2006.01)

(52) U.S. Cl. .................................. 716/4; 716/1; 716/2

(58) Field of Classification Search .................... 716/1, 716/2, 4

See application file for complete search history.

(56) References Cited

OTHER PUBLICATIONS

Jain et al., "Inverter Minimization in Multi-Level Logic Networks", Nov. 1993, IEEE/ACM International Conference on Computer-Aided Desig, Digest of Technical, pp. 462-465.*

* cited by examiner

Primary Examiner—Sun James Lin
(74) Attorney, Agent, or Firm—Rosenberg, Klein & Lee

(57) ABSTRACT

An integrated circuit design includes a description of a net for distributing a signal from a root node to one or more leaf nodes downstream of the root node. Some segments of the net include inverters and some segments branch into other segments. The IC design is processed to determine a maximum number of inverters that can be removed from the net without affecting a logic state of the signal as it arrives at the leaf nodes. For each segment of the net other than segments terminating on root or leaf nodes two corresponding data sets are generated: one data set indicates a maximum number of inverters that may be removed downstream of its corresponding segment without altering the logic state of the signal at any downstream leaf node, and the other data set indicates a maximum number of downstream inverters that may be removed that will alter the logic state of the signal arriving at every downstream leaf node. Each data set points to all data sets corresponding to segments immediately downstream of the data set's corresponding segment, so that the data sets for all segments form a decision tree that may be traversed to determine which inverters must be removed to maximize the number of inverters removed from the net without affecting the logic state of the signal arriving at each leaf node.

23 Claims, 3 Drawing Sheets

METHOD FOR IDENTIFYING REMOVABLE INVERTERS IN AN IC DESIGN

BACKGROUND OF THE INVENTION

1. Field of the Invention

The present invention relates in general to computer aided integrated circuit design tools and in particular to a method for identifying inverters that may be removed from nets described by an IC design.

2. Description of Related Art

An integrated circuit (IC) designer typically employs various design tools to create a gate level netlist describing an IC by listing the circuit components ("cells") to be formed in a semiconductor substrate and referencing the networks ("nets") that are to interconnect the cell terminals. However the gate level netlist does not indicate how the cells are to be positioned within the substrate and does not indicate how the nets interconnecting cell terminals are to be formed and routed. Therefore, after creating a gate level netlist, the designer typically employs a computer-aided placement and routing (P&R) tool for processing the netlist to generate an IC layout design indicating how each cell is to be positioned within the semiconductor substrate and indicating how the nets interconnecting the cells are to be formed. Each net includes conductors formed on conductive layers above the substrate and may also include buffers and inverters formed as cells within the substrate.

After the P&R tool generates an IC layout, the designer may employ other tools to check the IC layout to determine whether it meets various constraints the designer has placed on the layout. One such constraint relates to signal path delay. In IC implementing synchronous logic, includes clocked devices such as registers and flip-flops for coordinating signal timing between blocks of circuit logic. FIG. 1 depicts a block of logic including a set of four gates 1–4 connected between the output of one register 5 and the input of another register 6. Register 5 allows the input signals of gates 1–4 to change state only on edges of a clock signal (CLOCK), and register 6 passes stage changes in the output signals of gates 1–4 to a next logic block only in response to edges of the CLOCK signal. Registers 5 and 6 thus control the timing of state changes in the logic block's input and output signals so that they occur only at regular, predictable intervals.

A "signal path" within an IC is the logical path a signal follows between any two nodes on the IC. The circuit of FIG. 1 has many signal paths including, for example, the signal path between output 7 of register 5 and input 8 of register 6, the path including gates 2 and 3 and the conductors 9–11 that connect those gates between register terminals 7 and 8. The path delay through that signal path is the time required for a state change in the signal at register output 7 to cause a state chance in the signal at register input 8. A typical timing constraint on that signal path would limit its path delay to less than the period of the CLOCK signal so that a state change occurring in the signal at register output 7 at the start of one CLOCK signal cycle would produce a state change at register input 8 before the start of the next clock signal cycle.

To determine whether signal paths within an IC layout meets their timing constraints, a timing analysis tool determines the delay through each gate and each net section forming each signal path having a timing constraint. The timing analysis tool consults a cell library storing information about each type of cell that may be incorporated into an IC to determine the switching delays through the cells forming the signal paths. A timing analysis tool computes the path delay through each net section based on "RC extraction data" for that net section. The delay through each net section is mainly a function of the series resistance and shunt capacitance of the conductors forming the net section, and a resistance/capacitance (RC) extraction tool processes an IC layout to produce a large RC extraction database indicating the resistance and capacitance of each section of each net based on the physical dimensions of the net section, the distance to nearby ground and power conductors and the dielectric constant of materials there between.

After finding the delay though each cell and each net section of a signal path, the timing analysis tool sums the delays to determine the total signal path delay and then compares the signal path delay to the timing constraint for that signal path. When the path delay through a particular signal path is larger than allowed by its timing constraint, the timing analysis tool attempts to reduce the delay through the signal path by inserting one or more buffers or inverters in various net segments forming the signal path. Even though a buffer or an inverter adds its own switching delay to a signal path, adding a buffer or inverter to a relatively long signal path can reduce the total amount path delay by reducing the amount of time a signal needs to charge conductor capacitance downstream of the buffer. Both buffers and inverters can reduce signal path delays, but an inverter inverts the logic state of the signal it forwards along a path while a buffer does not. Therefore, when inserting inverters into net sections forming portions of signal paths, the timing analysis tool inserts only an even number of inverters into each signal path so that it does not invert the state of the signal at the input of any cell.

When an IC layout produced by a P&R tool fails to meet all criteria, the P&R tool modifies the layout, and since modifying an IC layout can alter path delays, a timing analysis tool may have to re-determine the number, size and locations of buffers and inverters inserted into various nets that are affected by the modification. To avoid providing more buffers and inverters in signal paths than are needed, it is preferable for a timing analysis tool to remove as many buffers and inverters as possible from the signal paths described by a IC layout before it calculates signal path delays and determines whether paths require additional buffers or inverters to satisfy timing constraints. However while a timing analysis tool can remove all buffers from a net without considering effects on signal circuit logic because buffers do not affect the logic state of the signal passing through them, a timing analysis tool may not be able to remove all of the inverters from a net because inverters affect the logic state of the signal passing though them.

FIG. 2 illustrates an example net for linking its "root node" R at the output of a cell generating a logic signal to "leaf" nodes L1 and L2 at the inputs of gates that receive the logic signal. A set of inverters 12–15 and buffers 16 and 17 are included in various sections of the net to reduce the path delay between root node R and leaf nodes L1 and L2. When this net is included in a layout to be modified, all of buffers 16 and 17 can be removed without altering the logic states of the signals arriving at leaf nodes L1 and L2, but it is necessary retain one or more of inverters 12–15 in the net in order to preserve the logic states of the signals arriving at nodes L1 and L2.

What is needed is a method for quickly determining which inverters to remove from a net so as to minimize the number of inverters remaining in the net without affecting logic states of signals arriving at the net's leaf nodes.

BRIEF SUMMARY OF THE INVENTION

An integrated circuit design includes descriptions of a set of nets, each for distributing a signal from its root node to one or more leaf nodes of the net downstream of the root node. Some of the segments of the net may include inverters and some segments of the net may branch into other segments. The invention relates to a method and a computer that may be employed to determine a maximum number of inverters that can be removed from the net without affecting a logic state of the signal as it arrives at the leaf nodes.

In accordance with the invention, two data sets are generated for each segment of the net starting with the segments immediately upstream of segments connected to the leaf nodes and working upstream toward the root node. One of the two data sets generate for each segment indicates a maximum number of inverters downstream of the segment that may be removed from the net without altering the logic state of the signal at any leaf node downstream of the segment. The other data set for each segment indicates a maximum number of downstream inverters that may be removed from the net that will alter the logic state of the signal arriving at every downstream leaf node. Each data set points to one of the two data sets corresponding to each segment immediately downstream of that data set's corresponding segment, and the pointers included in each data set link the data sets to form a decision tree having at its root the data sets for the root segment of the net that is connected to the root node. To determine which inverters to remove, the decision tree is traversed following the pointers in each data set, starting with the data set for the root segment indicating the maximum number of inverters downstream of the root segment that can be removed without affecting the state of the signal at any leaf node downstream of the leaf segment. During the traversal, as a data set for any segment is encountered, an inverter at the downstream end of the segment is removed if the number of inverters the data set indicates are to be removed exceeds the total number of inverters the data sets it points to indicate are to be removed.

The claims appended to this specification particularly point out and distinctly claim the subject matter of the invention. However those skilled in the art will best understand both the organization and method of operation of what the applicant(s) consider to be the best mode(s) of practicing the invention, together with further advantages and objects of the invention, by reading the remaining portions of the specification in view of the accompanying drawing(s) wherein like reference characters refer to like elements.

DETAILED DESCRIPTION OF THE INVENTION

Figure 1:
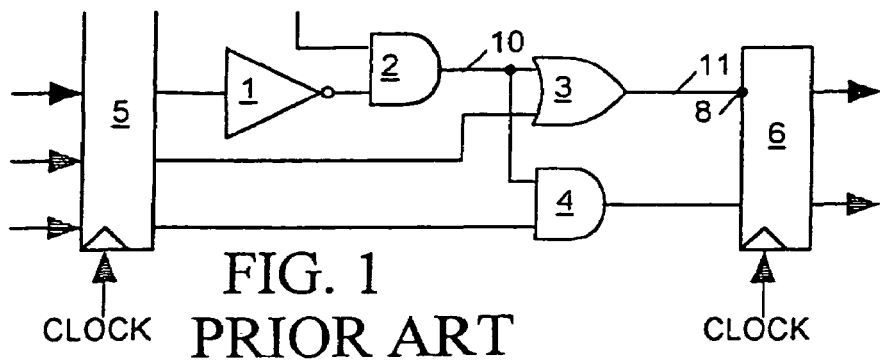
FIG. 1 illustrates a portion of an integrated circuit in block diagram form.

The present invention relates to software stored on computer-readable media which, when read and executed by a conventional computer, enables the computer to carry out a method for identifying inverters to be removed from nets of an integrated circuit (IC) design. Suitable computer-readable media for storing the software include, but are not limited to, compact disks, floppy disks, hard disks, and random access or read only memory. While this specification describes at least one exemplary embodiment of the invention considered to be a best mode of practicing the invention, those of skill in the art will appreciate that other modes of practicing the invention are possible.

A "signal path" within and IC is a logical path between a circuit node at the output of any one cell of an IC and a circuit node at the input of any other cell of the IC, including all logic gates residing between the two nodes and sections of nets that interconnect the gates to one another and to the nodes. For example in FIG. 1, the signal path between a node 7 at the output of a register 5 and a node 8 at the input of a register 6 includes gates 2 and 3 and sections of nets 9–11 of interconnecting the gates to one another and to nodes 7 and 8.

Figure 2:
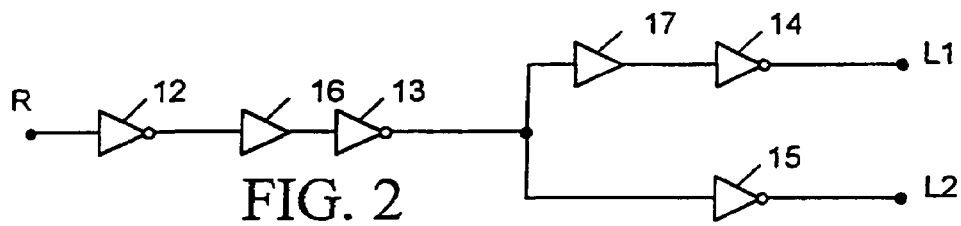
FIG. 2 illustrates a net of an integrated circuit in block diagram form.

As illustrated in FIG. 2, a "net" within an IC is network for conveying a signal from a root node (R) at the output of one cell of an IC to leaf nodes (L1, L2) at inputs of one or more other cells of the IC. Although a net may consist only of interconnected conductors, it may also include inverters 12–14 or buffers 16 and 17. When a net includes an odd number of inverters between its root node and any leaf node, it inverts the logic state of a signal as it passes between the root node and that leaf node. In the example of FIG. 2, since the net includes an odd number of inverters between root node R and each of leaf nodes L1 and L2, the net inverts the logic state of the signal before it arrives at each of leaf nodes L1 and L2.

Based on a netlist referencing all of the cells to be included in an IC, and indicating which cell terminals are to be interconnected with one another through nets, a conventional placement and routing (P&R) tool generates an IC layout indicating where each cell of an IC is to be positioned within a semiconductor substrate and indicating how conductors forming nets interconnecting cell terminals are to be routed. Initially most nets do not include any buffers and include no inverters unless the netlist indicates that the state of a signal passing from a root node to one or more of its leaf nodes is to be inverted. In that case, the P&R tool will add one or more inverters at appropriate places in the net to provide the necessary signal state inversion.

An IC designer may subject any signal path within an IC to a timing constraint requiring the signal delay through the path to be within some defined maximum. In the example of FIG. 1, the path delay through the signal path between nodes 7 and 8 is the sum of delays through gates 2 and 3 and the delay through the net sections 9–11 that link gates 2 and 3 to one another and to nodes 7 and 8. The IC designer may place that path under a timing constraint requiring that the path delay between circuit nodes 7 and 8 be less than the period of the CLOCK signal clocking registers 5 and 6. Under such constraint, a change in state of a signal at node 7 at the start of one cycle of the CLOCK signal must cause a change in state of the signal at node 11 before the start of the next clock signal cycle.

After the P&R tool generates a layout for the IC, a conventional resistance/capacitance (RC) extraction tool analyzes the layout to determine the resistance and capacitance of each section of each net. A conventional timing analysis tool then uses the data produced by the RC extraction data to estimate signal delays through sections of net forming portions of various signal paths. Based on the estimated signal delays within those net sections, and on estimated switching delays of cells included in each signal path, the timing analysis tool can estimate the total signal path delay within each signal path of the IC and then determine whether the estimated path delay meets any timing constraint an IC designer may have imposed on that signal path.

When the estimated delay of a signal path fails to satisfy a timing constraint, a timing analysis tool can reduce the path delay by inserting buffers and/or inverters of varying size into sections of the net that are included in the signal path. For example, an P&R tool may have initially laid out the net of FIG. 2 with only a single inverter 12 to provide signal inversion between root node R and leaf nodes L1 and L2 required by the netlist. However a timing analysis tool has added other inverters 13–15 and buffers 16, 17 to reduce path delays within signal paths containing sections of that net.

When signal paths within a layout fail to meet timing constraints and a timing analysis tool is unable sufficiently reduce path delays by inserting buffers or inverters, the P&R tool must modify the IC layout, for example by moving cells and rerouting nets, to reduce signal path distances. RC extraction and timing analysis tools can then reprocess the layout to determine whether path delays within the modified layout meet the timing constraints. When the IC layout is modified, it is helpful to remove as many buffers and inverters as possible from each net affected by the layout modification. After an RC extraction tool determines resistance and capacities of each net section of the modified layout, the timing analysis tool can the determine path delays through all modified signal paths and re-insert buffers and inverters into selected nets as necessary to satisfy timing constraints placed on those signal paths.

Figure 3:
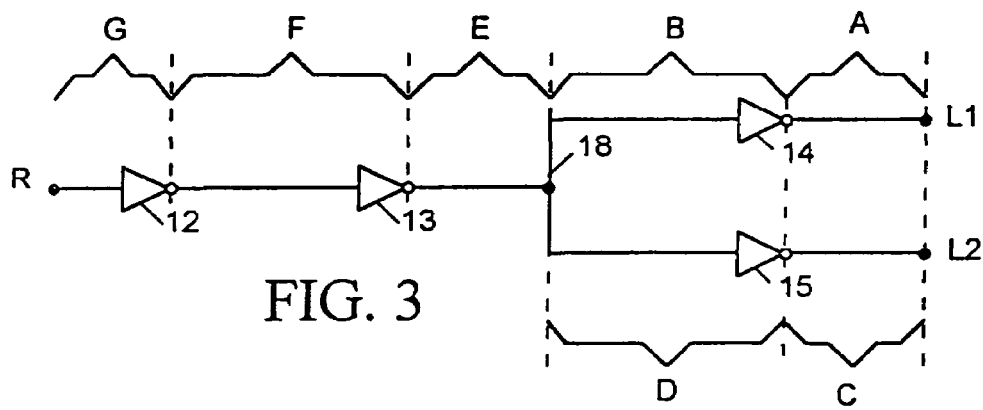
FIG. 3 illustrates another net of an integrated circuit in block diagram form.

For example, when the net of FIG. 2 has been rerouted, it preferable to initially modify the IC layout to remove all buffers 16 and 17 from the net as illustrated in FIG. 3 and to remove as many of inverters 12–15 as possible before the timing analysis reprocesses the layout because it enables the timing analysis tool to determine the best position and size for each buffer in the net. In this example it is not possible to remove all inverters 12–15 because the net must invert the signal supplied to root input node R before it reaches each node L1 and L2. To maintain the proper inversion logic, it is necessary for the modified layout to retain either inverter 12 or 13 or both of inverters 14 and 15. The preferable solution is to retain either of inverters 12 or 13 because this allows the maximum number of inverters to be removed from the net without affecting logic states of the signals at its leaf nodes.

The example net of FIG. 3 is sufficiently simple that we can determine by inspection that we should remove either inverter set (12, 14, 15) or set (13, 14, 15) in order to maximize the number of inverters removed without affecting signal states at leaf nodes L1 and L2. However networks within an IC layout can be much more complicated than illustrated in FIG. 2, because they can include many branches and leaf nodes, and varying numbers of inverters in the paths between the root node and each leaf node. Some of the leaf nodes of a net may receive an inverted signal and others may not. The invention provides an algorithm for enabling a computer-based timing analysis or P&R tool to automatically determine in a computationally efficient manner which inverters should be removed from any net of an IC layout so as to maximize the number of inverters removed from the net (after all buffers have been removed) without changing states of the signal arriving at each of its leaf nodes.

When all buffers have been removed from a net that includes buffers and inverters, the net consists of a root node, branch and leaf nodes, net segments and inverters. A net "segment" is a conductor that interconnects inverters, root nodes, branch nodes and/or leaf nodes. The net of FIG. 3 includes seven segments A–G, one root node R, one branch node 18, and two leaf nodes L1 and L2. Segment G is called a "root segment" because it is connected to root node R of the net, and segments A and C are called "leaf segments" because they are connected to leaf nodes L1 and L2. Segment E is a branch segment because it terminates at a branch node 18. All other segments terminate at inverter inputs.

Figure 4:
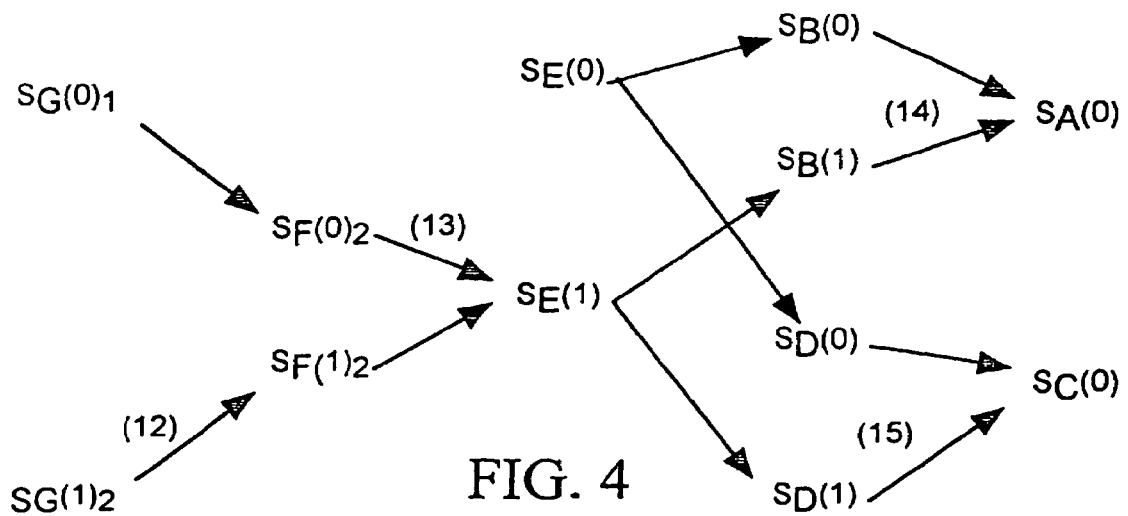
FIG. 4 graphically depicts a decision tree generated by a method in accordance with invention.

As illustrated in FIG. 4, an algorithm in accordance with the invention generates one or more data sets $S_u(0)$ or $S_u(1)$ for each segment (u) of a net starting with the leaf segments A and C and traversing the net back toward its root segment G. Each data set represents a different option with respect to removing inverters (if any) downstream of that segment, and the data sets for all segments are linked to form a decision tree as illustrated in FIG. 4. The $S_u(0)$ data set for each segment represents a particular course of action with respect to removing or retaining each inverter downstream of the segment that would produce no state change to the signal as it arrives at any leaf node downstream of that section. The $S_u(1)$ data set for each segment represents a course of action with respect to removing or retaining inverters downstream of the segment that would produce a state change to the signal as it arrives at every downstream leaf node.

Since there are no inverters downstream of segments A and C, there is only one possible course of action with respect to removing inverters downstream of those segments: do not remove. Thus the timing analysis tool initially generates only one data set $S_A(0)$ for segment A and one data set $S_C(0)$) for segment C to represent that course of action:

$$S_A(0)=(p, n, l)=(0,0,\text{NULL})$$

$$S_C(0)=(p, n, l)=(0,0,\text{NULL})$$

The "phase" field (p) of the data set for each segment indicates whether the course of action represented by the data set would result in signals at all leaf nodes downstream of segment A undergoing a state change. If a signal at a leaf node has state 0 before the action is carried out, and has state 1 after the action is carried out, then the action is considered to have resulted in a state change and the phase field p of the data set would be set to a 1. If the course of action does not result in a state change at the downstream leaf nodes, then the phase field is set to a 0. In this example the phase field (p) for each data set $S_A(0)$ and $S_C(0)$ is set to a "0" since no inverters downstream of segments A and C can be removed and therefore no state change in the signals at leaf nodes L1 and L2 can occur.

The "inverter count" field (n) of the data set for each segment represents a total number of inverters that would be removed downstream of segment if the course of action represented by data sets $S_A(0)$ and $S_C(0)$ were carried out. The inverter count fields n of data sets $S_A(0)$ and $S_C(0)$ are set to 0 because no inverters downstream of segments A or C are to be removed when the course of action represented by the data sets are carried out.

The "pointer list" field (l) of the data set for each segment includes a pointer to one or more data sets for other segments, if any, immediately downstream of the segment associated with the data set. Since there are no segments downstream of leaf segments A and C, the pointer list of data sets $S_A(0)$ and $S_C(0)$ is NULL.

With the data sets $S_A(0)$ and $S_C(0)$ established for all leaf segments A and C, the timing analysis tool generates the data sets corresponding to the next segments B and D immediately upstream of segments A and C as follows:

| Data set | Fields | Inverters removed |
|---|---|---|
| $S_B(0)$ | $(0, 0, S_A(0))$ | none |
| $S_B(1)$ | $(1, 1, S_A(0))$ | 14 |
| $S_D(0)$ | $(0, 0, S_C(0))$ | none |
| $S_D(1)$ | $(1, 1, S_C(0))$ | 15 |

In data set $S_B(0)=(p,n,l)$ the phase field p and inverter count field n are set to 0 because for the action represented by that data set, no inverters are to be removed downstream of segment B. The value of the phase field p is set to zero since in accordance with the course of action represented by the data set $S_B(0)$ there would be no state change in the signal at leaf node L1. The pointer list field p of data set $S_B(0)$ points to the data set $S_A(0)$ corresponding to segment A, immediately downstream of segment A. The phase field (p=0) of data set $S_B(0)$ indicates that if the course of action represented by $S_A(0)$ is carried out and if inverter 14 is not removed, then there will be no state change (p=0) in the signal arriving at leaf node cell L1 downstream of inverter 14. The inverter count field (n=0) of data set $S_B(0)$ indicates no inverters (n=0) downstream of segment B is to be removed.

The $S_B(1)$ data set represents a course of action in which inverter 14 is removed and in which the action represented by the referenced data set $S_A(0)$ (removing no inverter downstream of segment A) is carried out. Since the removal of inverter 14 has the effect of altering the state of the signal at downstream leaf node L1, the phase field (p=1) of $S_B(1)$ is determined by inverting the state of the phase field of $S_A(0)$. The value of inverter count field (n=1) of $S_B(1)$ is computed by adding 1 to the count field (n=)0 of $S_A(0)$ because an additional inverter 14 is removed. Data $S_D(0)$ indicates a course of action in which inverter 14 is not removed and data set $S_D(1)$ represents a course of action in which inverter 15 is removed.

Moving upstream, the algorithm next establishes two data sets for segment E as follows:

| Data set | Fields | Inverters removed |
|---|---|---|
| $S_E(0)$ | $(0, 0, S_B(0), S_D(0))$ | none |
| $S_E(1)$ | $(1, 2, S_B(1), S_D(1))$ | 14, 15 |

The pointer list of data set $S_E(0)$ points to data sets $S_B(0)$ and $S_D(0)$ and indicates that carrying out the action represented by $S_E(0)$ also includes carrying out the actions represented by data sets $S_B(0)$ and $S_D(0)$. The phase field value (p=0) of the $S_E(0)$ data set indicates that no phase changes will occur at any downstream leaf node, and the count field (n=0), computed as the sum of count fields of $S_B(0)$ and $S_D(0)$, indicates that no inverters downstream of segment E will be removed as a result of carrying out the option represented by $S_E(0)$.

The pointer list of data set $S_E(1)$ points to data sets $S_B(1)$ and $S_D(1)$ and indicates that carrying out the action represented by data set $S_E(1)$ also includes carrying out the action represented by data sets $S_B(1)$ and $S_D(1)$, which require removing inverters 14 and 15. The phase field of data set $S_E(1)$ has value of 1 indicating a phase change at all downstream leaf nodes will occur if the action represented by that data set is carried out. The count field of data set $S_E(1)$ is set to 2 to indicate that two inverters will be removed as a result of carrying out the action the data set represents.

A valid course of action represented by the data set for any segment must lead to consistent signal phase results at all signal leaf nodes downstream of the segment. Thus a valid course of action for segment E may result in a state change at both leaf nodes L1 and L2, or may result in no state change at both leaf nodes L1 and L2. However a course of action that leads to a state change at node L1 but no state change at node L2 is invalid. Thus for segment E a data set pointing, for example, to both $S_B(0)$ and $S_B(1)$ would be invalid because the action it represents would lead to inconsistent state change effects at leaf nodes L1 and L2.

Moving upstream to segment F, the algorithm initially generates four data sets as follows:

| Data set | Fields | Inverters removed |
|---|---|---|
| $S_F(0)_1$ | $(0, 0, S_E(0))$ | none |
| $S_F(0)_2$ | $(0, 3, S_E(1))$ | 13, 14, 15 |
| $S_F(1)_1$ | $(1, 1, S_E(1))$ | 13 |
| $S_F(1)_2$ | $(1, 2, S_E(0))$ | 14, 15 |

Four data sets are possible because there are four valid courses of action with respect to removing inverters downstream of segment F. But at this point the tool can discard two of the four data sets. Of the two different courses of action represented by data sets $S_F(0)_1$ and $S_F(0)_2$ that lead to no phase change in the signals at all leaf nodes downstream of segment F, the algorithm chooses the course of action represented by data set $S_F(0)_2$ because it involves removal of three downstream inverters 13, 14 and 15 while the course of action represented by data set $S_F(0)_1$ involves removal of no downstream inverters. Data set $S_FV(0)_1$ is therefore discarded. Of the two courses of action represented by data sets $S_F(1)_1$ and $S_F(1)_2$ resulting in a phase change at all downstream leaf nodes, the tool chooses the course of action represented by $S_F(1)_2$ option because it requires two inverters (14 and 15) to be removed rather than one (13). Thus the algorithm selects the following two data sets for segment F:

$$S_F(0)_2=(0, 3, S_E(1))$$

$$S_F(1)_2=(1, 2, S_E(0))$$

The algorithm is now ready to create data sets for the root segment G. Here again four options are possible based on which of the options represented by remaining two segment F data sets $S_F(0)$ or $S_F(1)$ is carried out with respect to removal of the downstream inverters 13, 14 and 15, and on whether or not inverter 12 is removed. The algorithm therefore initially generates four data sets for segment G as follows:

| Data set | Fields | Inverters Removed |
|---|---|---|
| $S_G(0)_1$ | $(0, 3, S_F(1)_2$ | 12, 14, 15 |
| $S_G(0)_2$ | $(0, 3, S_F(0)_2$ | 13, 14, 15 |
| $S_G(1)_1$ | $(1, 4, S_F(0)_2$ | 12, 13, 14, 15 |
| $S_G(1)_2$ | $(1, 2, S_F(0)_2$ | 14, 15 |

Since the tool has now reached the root segment G, the courses of actions represented by data sets $S_G(1)_1$ and $S_G(1)_2$ are unacceptable because they would lead to phase changes in the signals at all leaf nodes L1 and L2, and because there are no other inverters upstream of segment G that can be removed to eliminate the unacceptable phase changes. The algorithm therefore discards data sets $S_G(1)_1$ and $S_G(1)_2$. Either of the courses of action represented by remaining data sets $S_G(0)_1$ and $S_G(0)_2$ are acceptable because they produce no phase changes in the signal inputs to any leaf nodes and because they remove an equal number of inverters (3) from the net.

In this example, both remaining data sets describe actions that result in removing three inverters, so the algorithm can choose the course of action specified by either one of the two data sets. However in a case where one of the remaining data sets references a course of action permitting a larger number of inverters to be removed than any other remaining data set, the algorithm selects the course of action represented by that data set, because the maximum possible number of inverters would be removed from the net without affecting signal states at any leaf nodes.

The data sets generated for each segment A–G of the net of FIG. 3 form the graph illustrated in FIG. 4 with nodes of the graph representing the data sets and with edges of the graph representing pointers within the data sets. Each edge represents a course of action with respect to an inverter, and the number indicated in parentheses next to an edge references one of inverters 12–15 to be removed when following a course of action represented by the edge. After the algorithm has generated all of the data sets in the manner described above, it can choose either of root segment data sets $S_G(0)_1$ or $S_G(0)_2$ and then traverse the graph starting at the selected data set, and following the pointer or pointers included in each data set to a next data set until it reaches the data sets corresponding to the leaf segments. As the algorithm traverses the graph, it removes from the IC layout the inverters as indicated by information included in the data sets it encounters. The number indicated in parentheses next to an edge references one of inverters 12–15 to be removed when traversing that edge of the graph.

For example, after selecting and reading root segment data set $S_G(0)_1$, the algorithm sees that $S_G(0)_1$ points to $S_F(0)_2$. Comparing the count fields of $S_G(0)_1$ and $S_F(0)_2$ the tool sees that they have the same value (3) and therefore determines that the inverter 12 at the end of segment G is to be left in place. Following the pointer in $S_F(0)_2$ to $S_E(1)$, the algorithm sees that the value of the count field drops from 3 to 2, thereby indicating that inverter 13 at the end of segment F is to be removed. The pointers in $S_E(1)$ next direct the algorithm to both data sets $S_B(1)$ and $S_D(1)$, and the similarity between the phase fields in $S_B(1)$ and $S_D(1)$ indicates no inverter at the end of segment E is to be removed. Following the pointers in data sets $S_B(1)$ and $S_D(1)$ to data sets $S_A(0)$ and $S_C(0)$ and comparing their phase fields to the phase fields of $S_B(1)$ and $S_D(1)$, the algorithm determines that inverters 14 and 15 at the ends of segments B and D are to be removed. The algorithm ends the graph traversal at $S_A(0)$ and $S_D(0)$ when it encounters count fields having 0 values.

Thus upon selecting option $S_G(0)_1$, the graph formed by the data sets can direct the algorithm to remove the set of inverters {13, 14, 15}. Had data set $S_G(0)_2$ instead been chosen as the root of the traversal, the graph would have directed the algorithm to remove the set of inverters {12, 14, 56}. In either case a maximum number (3) of inverters would be removed from the net without affecting the states of signals arriving at leaf nodes L1 and L2.

Figure 5:
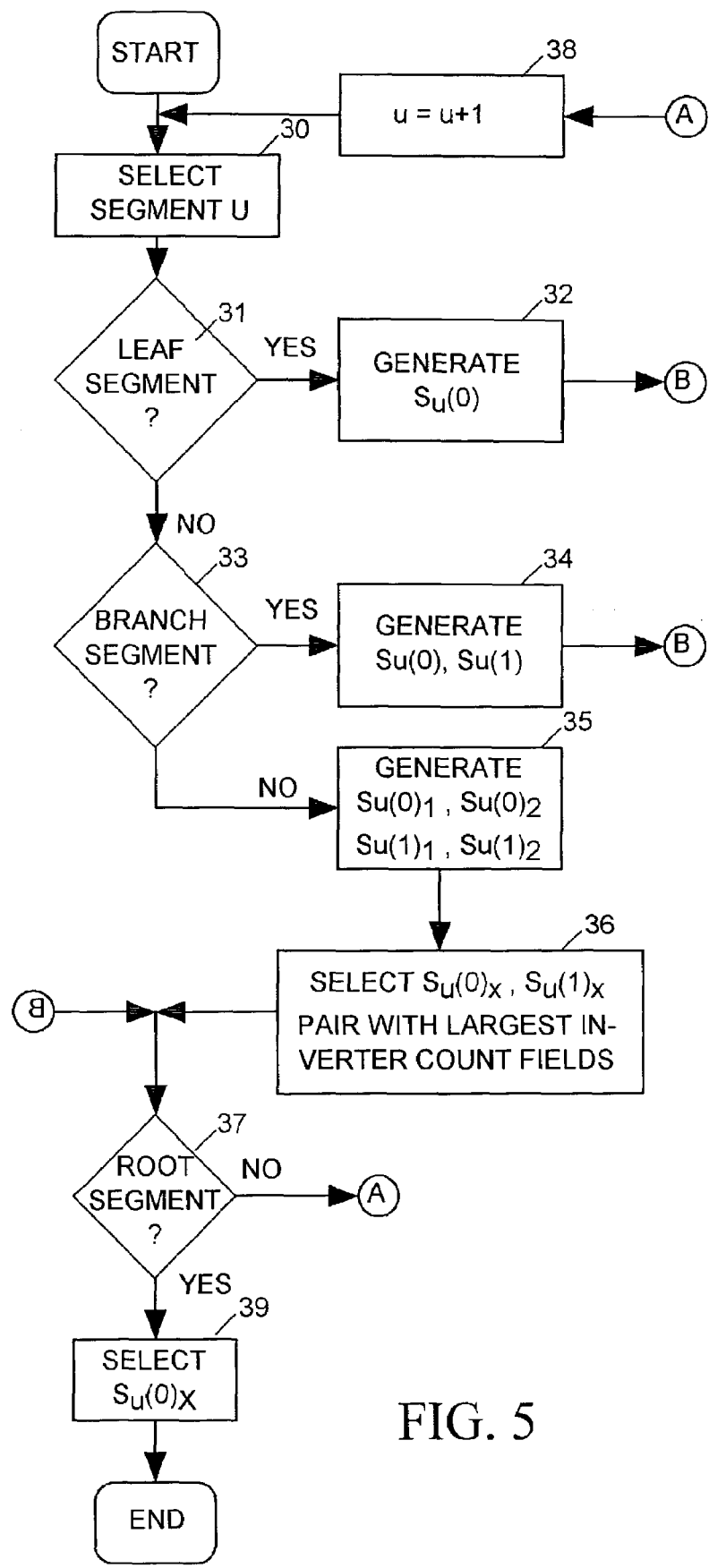
FIG. 5 is a flow chart illustrating a method in accordance with the invention for processing a net design to generate a decision tree of the type illustrated in FIG. 4.

FIG. 5 is a flow chart depicting an algorithm for generating the data sets forming a decision tree for determining which inverters can be removed from a net. The algorithm selects each segment (u) of the net in succession, starting with the leaf segments and working back toward the root segment, and computes the data set(s) for net segment when selected. The algorithm selects each segment upstream of a leaf segment only after it has selected and created data sets for all of its downstream segments.

Starting at step 30, the algorithm selects a next segment to be processed (initially a leaf segment) and if the selected segment u is a leaf segment (step 31) the algorithm generates (at step 32) a single data set for the leaf segment as follows:

$$S_u(0)=\{0,0,\text{NULL}\}.$$

If the segment selected at step 30 is a branch segment (step 33), the algorithm generates (at step 45) two data sets for the selected segment as follows:

$$S_u(0)=\{0,n,S_i(0)\ldots\}$$

$$S_u(1)=\{1,n,s_i(1)\ldots\}.$$

The list pointer fields l of the $S_u(0)$ and $S_u(1)$ data set contain pointers to the previously created data sets $S_i(0)$ and $S_i(1)$, respectively, for each ith segment into which branch segment u branches. The inverter count fields n of the $S_u(0)$ and $S_u(1)$ data sets represent the sums of the inverter count fields n of the previously created data sets $S_i(0)$ and $S_i(1)$, respectively, for each ith segment into which branch segment u branches.

If the segment u selected at step 30 is not a leaf segment or branch segment (steps 31, 33), then it is terminated by an inverter, and the algorithm initially generates (step 35) four separate data sets as follows:

$$S_u(0)_1=\{0,n,S_{u-1}(0)\}$$

$$S_u(0)_2=\{0,n+l,S_{u-1}(1)\}$$

$$S_u(1)_1=\{1,n+l,S_{u-1}(0)\}$$

$$S_u(1)_2=\{1,n,S_{u-1}(1)\}.$$

The list pointer field of the data set $S_u(0)_1$ for segment u points to the data set $S_{u-1}(0)$ for the segment u-1 immediately downstream of segment u. The count field of data set $S_u(0)_1$ matches the count field n of data set $S_{u-1}(0)$ The list pointer field of the data set $S_u(0)_2$ for segment u points to the data set $S_{u-1}(1)$ for segment u-1 and the count field of data set $S_u(0)_1$ is one larger than the count field n of data set $S_{u-1}(0)$.

The list pointer field of the data set $S_u(1)_1$ for segment u points to the data set $S_{u-1}(0)$ for segment u-1 and the count field of data set $S_u(1)$ is one larger than the count field n of data set $S_{u-1}(0)$.

The list pointer field of the data set $S_u(1)_2$ for segment u points to the data set $S_{u-1}(0)$ for segment u-1. The count field of data set $S_u(0)_1$ matches the count field n of data set $S_{u-1}(1)$.

The algorithm then selects one of data sets $S_u(0)_1$ and $S_u(0)_2$ having the inverter larger count field, and selects one of data sets $S_u(1)_1$ and $S_u(1)_2$ having the larger inverter count fields as the data sets for segment m (step 36).

After step 32, 34 or 36, if last selected segment u is not a root segment (step 37), then at step 38 the algorithm increments u (step 38) and returns to step 30 to select a next segment of the network. After the algorithm has selected every segment at step 30 and has created data sets for each segment at steps 32, 34 or 35/36, the last selected segment will be the root segment (step 37). At that point (step 39), the algorithm selects the data set $S_u(0)x=S_u(0)_1$ or $S_u(0)x=S_u(0)_2$ last selected at step 36 as the single data set for the root segment.

Figure 6:
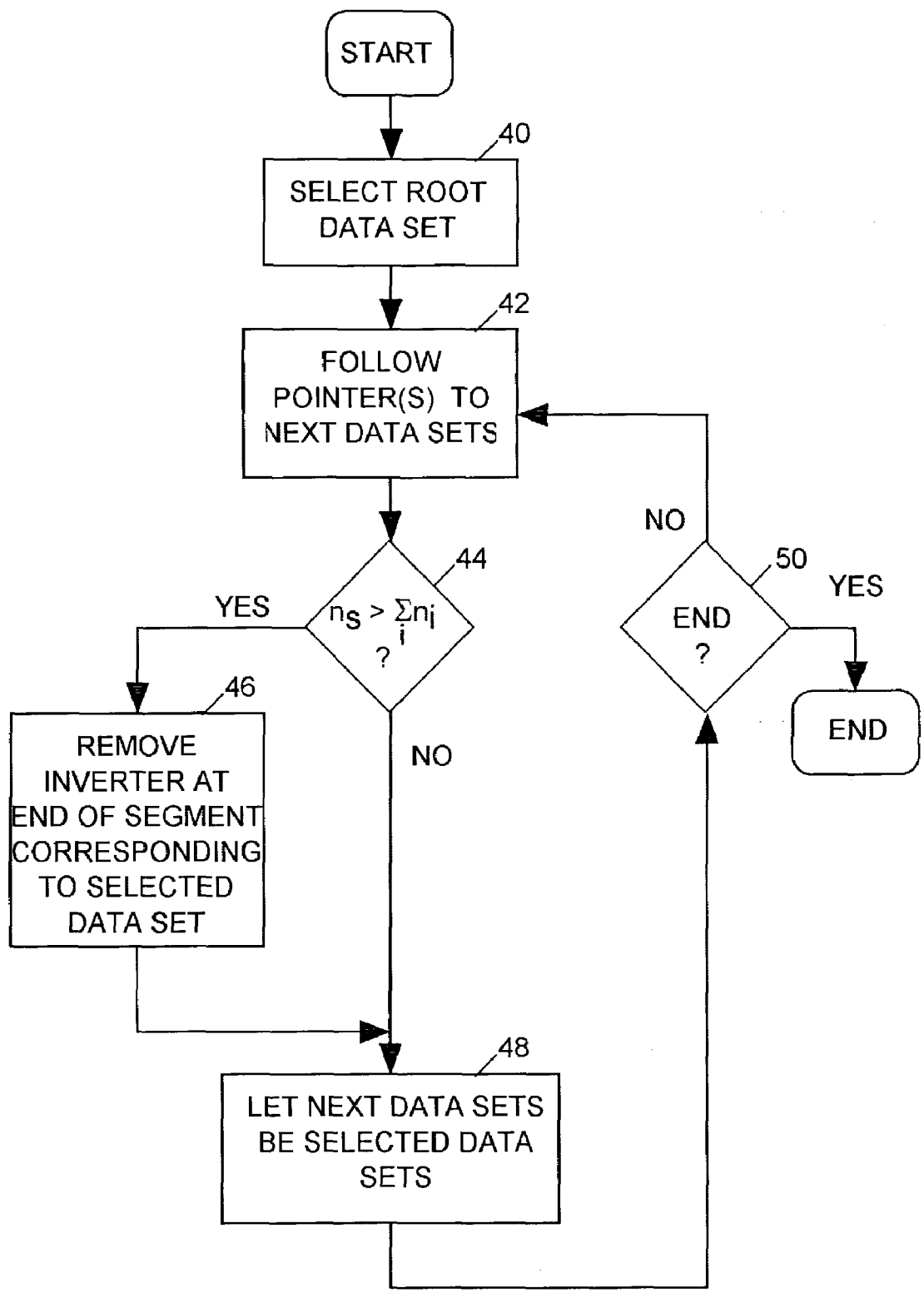
FIG. 6 is a flow chart illustrating a method in accordance with the invention for traversing the decision tree produced by the method of FIG. 5.

FIG. 6 illustrates an algorithm for traversing a decision tree created by the algorithm of FIG. 5 to determine which inverters to remove from a net. The root data set requiring no signal state changes at the leaf nodes and having the largest inverter count field n is initially chosen as a "selected" data set at step 40. The algorithm then follows the pointer or pointers included in the selected data set to one or more "next" data sets corresponding to the segment or segments immediately downstream of the root segment (step 42). If the inverter count filed $n_s$ of the selected data set is larger than the sum of the inverter count fields $n_i$ of each ith next data set, then the algorithm removes the inverter at the end of the segment corresponding to the selected data set (step 46). Thereafter, the algorithm treats each of the "next" data sets as a selected data set (step 48) and returns to step 42. It then follows the pointer(s) in each selected data set to next data sets of the decision tree and determines at step 44 for each selected data set whether an inverter at the end of its corresponding segment is to be removed at step 46. The algorithm continues to loop through steps 42–48 until it has traversed the decision tree to the leaf nodes (step 50). At that point a maximum number of inverters will have been removed from the net without affecting states of signal arriving at the net's leaf nodes.

The foregoing specification and the drawings depict exemplary embodiments of the best mode(s) of practicing the invention, and elements or steps of the depicted best mode(s) exemplify the elements or steps of the invention as recited in the appended claims. However the appended claims are intended to apply to any mode of practicing the invention comprising the combination of elements or steps as described in any one of the claims, including elements or steps that are functional equivalents of the example elements or steps of the exemplary embodiment(s) of the invention depicted in the specification and drawings.

The invention claimed is:

1. A method for processing an integrated circuit (IC) design including a description of a net for conveying a signal downstream from a root node to a plurality of leaf nodes wherein the net comprises a plurality of inverters and a plurality of a segments including a single root segment connected to the root node, a plurality of inverter segments, each terminating at an input of a separate one of the inverters, at least one branch segment branching into a plurality of other net segments, and at least one leaf segment, each terminating at a separate one of the leaf nodes, the method comprising the steps of:
   a. generating one data set corresponding to each leaf segment;
   b. generating two data sets corresponding to each branch segment;
   c. generating two data sets corresponding to each inverter segment; and
   d. generating one data set corresponding to the root segment, wherein each data set corresponding to any one of the segments indicates a total number of inverters to be removed downstream of the segment, indicates whether removal of the indicated number of inverters downstream of the corresponding segment will affect a logic state of the signal as it arrives at any leaf node downstream of the corresponding segment, wherein each data set corresponding to any one of the segments indicates whether it terminates on a downstream inverter that is to be removed, and wherein each data set corresponding to any one of the segments references a data set corresponding to each segment immediately downstream of its corresponding segment.

2. The method in accordance with claim 1 wherein each data set generated at any of steps b–d is generated only after all data sets corresponding to all segments downstream of a corresponding segment have been generated.

3. The method in accordance with claim 1
   wherein one of the two data sets corresponding to each branch or inverter segment indicates a maximum number of inverters that can be removed downstream of the corresponding segment without affecting the logic state of any signal arriving at any leaf node downstream of the corresponding segment, and
   wherein another of the two data sets corresponding to each branch or inverter segment indicates a maximum number of inverters that can be removed downstream of the corresponding segment that will affect the logic state of any signal arriving at every leaf node downstream of the corresponding segment.

4. The method in accordance with claim 1 wherein each data set corresponding to each branch segment references a plurality of data sets corresponding to a plurality of segments into which it branches.

5. The method in accordance with claim 1
   wherein one of the two data sets corresponding to each branch or inverter segment indicates a maximum number of inverters that can be removed downstream of the corresponding segment without affecting the logic state of any signal arriving at any leaf node downstream of the corresponding segment, and
   wherein another of the two data sets corresponding to each branch or inverter segment indicates a maximum number of inverters that can be removed downstream of the corresponding segment that will affect the logic state of any signal arriving at every leaf node downstream of the corresponding segment.

6. The method in accordance with claim 1 further comprising the step of:
   e. modifying the description of the net to remove the number of inverters downstream of the root segment indicated by the root segment's corresponding data set.

7. The method in accordance with claim 6 further comprising the steps of:
   f. reading each data set corresponding to a segment to determine all data sets it references and to determine a number of downstream inverters each data set indicates are to be removed, and
   g. for each segment, modifying the description of the net to remove an inverter upon which that segment terminates only when the number of downstream inverters that segment's corresponding data set indicates are to be removed is larger than a sum of numbers of downstream inverters all data sets referenced by that segment's corresponding data set indicate are to be removed from the net.

8. The method in accordance with claim 6 wherein step e comprises the substeps of:
   e1. reading each data set corresponding to a segment to determine all data sets it references and to determine a number of downstream inverters each data set indicates are to be removed; and
   e2. for each segment, modifying the description of the net to remove an inverter upon which that segment terminates only when the number of downstream inverters that segment's corresponding data set indicates are to be removed is larger than a sum of numbers of downstream inverters all data sets referenced by that segment's corresponding data set indicate are to be removed from the net.

9. The method in accordance with claim 8 wherein the data set corresponding to the root segment is read first at step f and each data set corresponding any segment other than the root segment is read at step e2 only after a data segment that references it is read at one of steps e1 or e2.

10. The method in accordance with claim 8
   wherein one of the two data sets corresponding to each branch or inverter segment indicates a maximum number of inverters that can be removed downstream of the corresponding segment without affecting the logic state of any signal arriving at any leaf node downstream of the corresponding segment,
   wherein another of the two data sets corresponding to each branch or inverter segment indicates a maximum number of inverters that can be removed downstream of the corresponding segment that will affect the logic state of any signal arriving at every leaf node downstream of the corresponding segment, and
   wherein the data set corresponding to the root segment is read first at step e1 and each data set corresponding any segment other than the root segment is read at step g only after a data segment that references it is read at step e1.

11. The method in accordance with claim 10
   wherein one of the two data sets corresponding to each branch or inverter segment indicates a maximum number of inverters that can be removed downstream of the corresponding segment without affecting the logic state of any signal arriving at any leaf node downstream of the corresponding segment, and
   wherein another of the two data sets corresponding to each branch or inverter segment indicates a maximum number of inverters that can be removed downstream of the corresponding segment that will affect the logic state of any signal arriving at every leaf node downstream of the corresponding segment.

12. Computer readable media, which when read and executed by a computer, causes the computer to carry out a method for processing an integrated circuit (IC) design including a description of a net for conveying a signal downstream from a root node to a plurality of leaf nodes wherein the net comprises a plurality of inverters and a plurality of a segments including a single root segment connected to the root node, a plurality of inverter segments, each terminating at an input of a separate one of the inverters, at least one branch segment branching into a plurality of other net segments, and at least one leaf segment, each terminating at a separate one of the leaf nodes, wherein the method comprises the steps of:

a. generating one data set corresponding to each leaf segment;
   b. generating two data sets corresponding to each branch segment;
   c. generating two data sets corresponding to each inverter segment; and
   d. generating one data set corresponding to the root segment, wherein each data set corresponding to any one of the segments indicates a total number of inverters to be removed downstream of the segment, indicates whether removal of the indicated number of inverters downstream of the corresponding segment will affect a logic state of the signal as it arrives at any leaf node downstream of the corresponding segment, wherein each data set corresponding to any one of the segments indicates whether it terminates on a downstream inverter that is to be removed, wherein each data set corresponding to any one of the segments references a data set corresponding to each segment immediately downstream of its corresponding segment.

13. The computer readable media in accordance with claim 12 wherein each data set generated at any of steps b–d is generated only after all data sets corresponding to all segments downstream of a corresponding segment have been generated.

14. The computer readable media in accordance with claim 12
   wherein one of the two data sets corresponding to each branch or inverter segment indicates a maximum number of inverters that can be removed downstream of the corresponding segment without affecting the logic state of any signal arriving at any leaf node downstream of the corresponding segment, and
   wherein another of the two data sets corresponding to each branch or inverter segment indicates a maximum number of inverters that can be removed downstream of the corresponding segment that will affect the logic state of any signal arriving at every leaf node downstream of the corresponding segment.

15. The computer readable media in accordance with claim 12
   wherein each data set corresponding to each branch segment references a plurality of data sets corresponding to a plurality of segments into which it branches.

16. The computer readable media in accordance with claim 12
   wherein one of the two data sets corresponding to each branch or inverter segment indicates a maximum number of inverters that can be removed downstream of the corresponding segment without affecting the logic state of any signal arriving at any leaf node downstream of the corresponding segment, and
   wherein another of the two data sets corresponding to each branch or inverter segment indicates a maximum number of inverters that can be removed downstream of the corresponding segment that will affect the logic state of any signal arriving at every leaf node downstream of the corresponding segment.

17. The computer readable media in accordance with claim 12 further comprising the step of:
   e. modifying the description of the net to remove the number of inverters downstream of the root segment indicated by the root segment's corresponding data set.

18. The computer readable media in accordance with claim 17 wherein the method further comprises the steps of:

f. reading each data set corresponding to a segment to determine all data sets it references and to determine a number of downstream inverters each data set indicates are to be removed, and g. for each segment, modifying the description of the net to remove an inverter upon which that segment terminates only when the number of downstream inverters that segment's corresponding data set indicates are to be removed is larger than a sum of numbers of downstream inverters all data sets referenced by that segment's corresponding data set indicate are to be removed from the net.

19. The computer readable media in accordance with claim 17 wherein step e comprises the substeps of:

e1. reading each data set corresponding to a segment to determine all data sets it references and to determine a number of downstream inverters each data set indicates are to be removed; and e2. for each segment, modifying the description of the net to remove an inverter upon which that segment terminates only when the number of downstream inverters that segment's corresponding data set indicates are to be removed is larger than a sum of numbers of downstream inverters all data sets referenced by that segment's corresponding data set indicate are to be removed from the net.

20. The computer readable media in accordance with claim 19 wherein the data set corresponding to the root segment is read first at step f and each data set corresponding any segment other than the root segment is read at step e2 only after a data segment that references it is read at one of steps e1 or e2.

21. The computer readable media in accordance with claim 19 wherein one of the two data sets corresponding to each branch or inverter segment indicates a maximum number of inverters that can be removed downstream of the corresponding segment without affecting the logic state of any signal arriving at any leaf node downstream of the corresponding segment, wherein another of the two data sets corresponding to each branch or inverter segment indicates a maximum number of inverters that can be removed downstream of the corresponding segment that will affect the logic state of any signal arriving at every leaf node downstream of the corresponding segment, and wherein the data set corresponding to the root segment is read first at step e1 and each data set corresponding any segment other than the root segment is read at step g at step only after a data segment that references it is read at step e1.

22. The computer readable media in accordance with claim 21 wherein one of the two data sets corresponding to each branch or inverter segment indicates a maximum number of inverters that can be removed downstream of the corresponding segment without affecting the logic state of any signal arriving at any leaf node downstream of the corresponding segment, and wherein another of the two data sets corresponding to each branch or inverter segment indicates a maximum number of inverters that can be removed downstream of the corresponding segment that will affect the logic state of any signal arriving at every leaf node downstream of the corresponding segment.

23. A method of processing an integrated circuit design including a description of a net for distributing a signal from a root node to one or more leaf nodes downstream of the root node, wherein some segments of the net include inverters and some segments branch into other segment, for determining a maximum number of inverters that can be removed from the net without affecting a logic state of the signal as it arrives at the leaf nodes, the method comprising the steps of:

a. for each segment, generating two corresponding data sets, wherein one data set indicates a maximum number of removable inverters downstream of that segment without altering the logic state of the signal at any downstream leaf node, wherein the other data set indicates a maximum number of removable inverters downstream of that segment that will alter the logic state of the signal arriving at every downstream leaf node, and wherein each data set points to one of two data sets corresponding to each segment, if any, immediately downstream of that data set's corresponding segment, such that the data sets form a decision tree;

b. traversing the decision tree to determine which inverters are to be removed to maximize the number of inverters removed from the net without affecting the logic state of the signal arriving at each leaf node; and c. modifying the description of the net so that it no longer includes the inverters determined at step b to be removed.

\* \* \* \* \*